*(12)* United States Patent
Singh et al.

(10) Patent No.: US 6,994,769 B2
(45) Date of Patent: Feb. 7, 2006

(54) IN-SITU CLEANING OF A POLYMER COATED PLASMA PROCESSING CHAMBER

(75) Inventors: Harmeet Singh, Berkeley, CA (US); John E. Daugherty, Newark, CA (US); Vahid Vahedi, Albany, CA (US); Saurabh J. Ullal, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/881,112

(22) Filed: Jun. 29, 2004

(65) Prior Publication Data

US 2004/0231800 A1    Nov. 25, 2004

Related U.S. Application Data

(62) Division of application No. 10/186,917, filed on Jun. 28, 2002, now Pat. No. 6,776,851.

(51) Int. Cl.
*C23F 1/00*        (2006.01)
(52) U.S. Cl. .................... 156/345.51; 156/345.35; 156/345.36; 156/345.41; 156/345; 156/43; 156/345.47; 156/345.48; 118/723 R
(58) Field of Classification Search ........... 156/345.43, 156/345.44, 345.47, 345.48, 345.51, 345.35, 156/345.36, 345.41; 118/723 R, 723 E, 118/728
See application file for complete search history.

(56) References Cited

U.S. PATENT DOCUMENTS

| 4,252,595 A | * | 2/1981 | Yamamoto et al. ..... 156/345.31 |
| 4,341,616 A | * | 7/1982 | Nagatomo et al. ...... 204/298.31 |
| 5,622,565 A | * | 4/1997 | Ye et al. ................. 118/723 R |
| 6,083,412 A | * | 7/2000 | Rice et al. ..................... 216/67 |

FOREIGN PATENT DOCUMENTS

| JP | 4-91432 | * | 3/1992 |
| JP | 7-106301 | * | 4/1995 |

* cited by examiner

*Primary Examiner*—M. Kornakov
(74) *Attorney, Agent, or Firm*—Martine Penilla & Gencarella, LLP

(57) ABSTRACT

An apparatus configured to remove chamber deposits between process operations is provided. The processing chamber includes a top electrode in communication with a power supply. A processing chamber defined within a base, a sidewall extending from the base, and a top disposed on the sidewall is provided. The processing chamber has an outlet enabling removal of fluids within the processing chamber. The processing chamber includes a substrate support and an inner surface of the processing chamber defined by the base, the sidewall and the top. The inner surface is coated with a fluorine containing polymer coating. The fluorine containing polymer coating is configured to release fluorine upon creation of an oxygen plasma in the processing chamber to remove a residue deposited on the fluorine containing polymer coating. The residue was deposited on the polymer coating from a processing operation performed in the processing chamber.

9 Claims, 6 Drawing Sheets

IN-SITU CLEANING OF A POLYMER COATED PLASMA PROCESSING CHAMBER

CROSS REFERENCE TO RELATED APPLICATIONS

This application is a divisional application of U.S. patent application Ser. No. 10/186,917, filed Jun. 28, 2002, now U.S. Pat. No. 6,776,851 and entitled "IN-SITU CLEANING OF A POLYMER COATED PLASMA PROCESSING CHAMBER." The disclosure of this related application is incorporated herein by reference for all purposes.

BACKGROUND OF THE INVENTION

1. Field of the Invention

This invention generally relates to an apparatus and method of cleaning a processing chamber to remove previously deposited chamber residues, which have accumulated on interior surfaces of the apparatus. In particular, the invention relates to a polymer coating being applied to the inner surfaces of a processing chamber that is removed along with any residues deposited on the coating during processing operations.

2. Description of the Related Art

As semiconductor processes deal with smaller geometries being defined on semiconductor substrates it is becoming more difficult to maintain the uniformity and accuracy of critical dimensions. Moreover, it has become increasingly important that the environment inside the processing chamber be clean and consistent to ensure acceptable wafer to wafer variability of the critical dimensions. As is known in the art, many of the processes carried out within the semiconductor processing chambers leave deposits on the inner surfaces of the processing chamber. As these deposits accumulate over time, they can become a source of particulate contamination that is harmful to the substrates being processed. For example, the particulate contamination may flake off and fall onto the surface of the substrate if the particulate contamination is allowed to build up over time.

Although care and caution is involved during the monitoring of a chemical process, more often than not, undesired residues are deposited on the inner surfaces of the process chambers where the processes are taking place. The undesired residues, unfortunately, get deposited in and around the walls of the processing chamber. The build up of residues inside the processing chamber, over time, not only make the processes unreliable and shifted from baseline, but also result in degraded, defective substrates due to particulate contamination that builds up over time on the inner surfaces of the chamber. Without frequent cleaning procedures, impurities from the residue deposited on the chamber's inner surfaces can migrate onto the substrate. In addition, process etch rates or deposition rates can vary over time due to the changing chamber conditions from residue build-up resulting in out of control process performance. As alluded to above, the build up of deposits on the inner surfaces of the chamber causes an inconsistent environment which impacts the processing operation being performed. That is, the build up of deposits increases with each processing operation. Thus, each successive processing operation does not initiate with the same chamber conditions. Accordingly, the changed starting conditions for each successive processing operation causes a variance that eventually exceeds acceptable limits, which results in etch rate drift, critical dimension drift, profile drift, etc.

One attempt to solve these issues has been to run in-situ cleaning processes in between processing operations. However, these cleaning processes tend to leave residues of their own behind. Thus, as a result of attempting to clean the processing chamber of one contaminant, the cleaning process leaves behind another residue that may build up over time and eventually flake off onto a semiconductor substrate. In addition, failure to completely clean the etch chamber effects the processing of the next semiconductor substrate. That is, the reproducibility and repeatability of the etch rate from wafer to wafer is gradually impacted such that the processing chamber will have to be wet cleaned in order to perform processing within acceptable limits. Thus, the system throughput is adversely impacted because of the restricted mean time between wet cleans.

FIG. 1 is a simplified cross-sectional view of an etch chamber. Etch chamber 100 includes RF coil 102 disposed over window 104. A semiconductor substrate 106 to be processed rests on substrate support 108. In between each process operation, a wafer-less auto clean (WAC) process can be performed in order to minimize buildup of residues on the inner surface of etch chamber 100. However, it has been observed that the WAC process itself leaves particulates or residues 110, on the inner surfaces of chamber 100. As more residue 110 accumulates on the inner surfaces, the impact on the processing operation, such as an etch operation, becomes more severe because of the residue buildup.

Eventually a wet clean operation must be performed to remove residues that are not entirely removed by the in-situ cleaning process or residues left behind by the cleaning process. Unfortunately, such cleaning operations affect a substrate processing system's utilization in a variety of ways. For example, system utilization is reduced by the time involved in performing cleaning operations. When a wet clean is performed, opening the processing chamber and physically wiping the chamber's interior surfaces results in even more downtime because the processing environment must subsequently be re-stabilized. Moreover, the re-stabilization of the chamber condition requires processing many wafers to condition the chamber back to the pre-wet clean operating chamber state without excessive residue build-up.

In view of the foregoing, what is needed is a method and apparatus for in-situ cleaning of a process chamber that does not leave any residue, so that the chamber state is the same for every wafer being processed, thereby allowing for reproducible and repeatable process operations for each successive wafer and extending the mean time between wet cleans.

SUMMARY OF THE INVENTION

Broadly speaking, the present invention fills these needs by providing a method and apparatus for in-situ cleaning of a process chamber that provides a removable coating to the inner surfaces of the process chamber. The removable coating allows for consistent starting conditions for each wafer being processed. It should be appreciated that the present invention can be implemented in numerous ways, including as an apparatus, a system, a device, or a method. Several inventive embodiments of the present invention are described below.

In one embodiment, a method for removing chamber deposits in between process operations of a semiconductor process chamber is provided. The method initiates with depositing a carbon and fluorine containing polymer layer over an inner surface of a semiconductor process chamber when the semiconductor chamber is empty. Then, a wafer is introduced into the semiconductor process chamber after depositing the fluorine containing polymer layer. Next, a process operation is performed on the wafer. The process operation deposits a residue on the fluorine containing polymer layer covering the inner surface of the semiconductor process chamber. Then, the wafer is removed from the semiconductor process chamber. Next, an oxygen based cleaning operation is performed. The oxygen based cleaning operation liberates fluorine from the fluorine containing polymer layer to remove a silicon based residue.

In another embodiment, a method for cleaning a process chamber to provide substantially similar starting conditions for each process operation is provided. The method initiates with introducing a wafer into a process chamber. Then, a process operation is performed on the wafer. Next, a solid source of fluorine is deposited on the inner surfaces of the process chamber as part of the process operation. Then, the wafer is removed from the process chamber. Next, an oxygen plasma cleaning operation is performed to remove carbon and silicon based residues deposited from the process operation.

In yet another embodiment, a semiconductor processing chamber is provided. The processing chamber includes a top electrode in communication with a power supply. A processing chamber defined within a base, a sidewall extending from the base, and a top disposed on the sidewall is provided. The processing chamber has an outlet enabling removal of fluids within the processing chamber. The processing chamber includes a substrate support and an inner surface of the processing chamber defined by the base, the sidewall and the top. The inner surface is coated with a fluorine containing polymer coating. The fluorine containing polymer coating is configured to release fluorine upon creation of an oxygen plasma in the processing chamber to remove a residue deposited on the fluorine containing polymer coating. The residue was deposited on the polymer coating from a processing operation performed in the processing chamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention is described which provides a method and apparatus for providing the same starting conditions for the plasma processing of each wafer in a series of wafers. The same starting conditions are provided by applying a polymer coating to the inner surfaces of the plasma processing chamber prior to introduction of the wafer. It will be obvious, however, to one skilled in the art, that the present invention may be practiced without some or all of these specific details. In other instances, well known process operations have not been described in detail in order not to obscure the present invention.

The embodiments of the present invention provide a method and apparatus for applying a polymer coating that allows for the efficient removal of residues deposited on the polymer coating during wafer processing operations. The polymer coating is configured to include a plasma cleaning agent that is liberated upon a wafer-less auto clean (WAC) process performed on the chamber after a processing step. In one embodiment, the polymer coating includes a fluorine containing polymer wherein the fluorine is liberated during the cleaning process to remove the residues deposited from the cleaning process. In another embodiment, the polymer coating has an average chemical formula of $CF_x$, where x is a real number between 1 and 4.

The polymer coating provides a baseline starting condition that is repeated for each wafer being processed. Accordingly, process repeatability is ensured from wafer to wafer, thereby resulting in substantial elimination of variation caused by incrementally changing starting conditions experienced by each successive wafer. It should be appreciated that the material composition of the chamber is irrelevant when the polymer pre-coat is applied to the inner surfaces of the chamber. While the embodiments described below are discussed with reference to silicon etching, such as shallow trench isolation (STI) and polysilicon gate etching, the embodiments can be applied to other suitable etching and deposition processes used in semiconductor fabrication processes.

Figure 1:
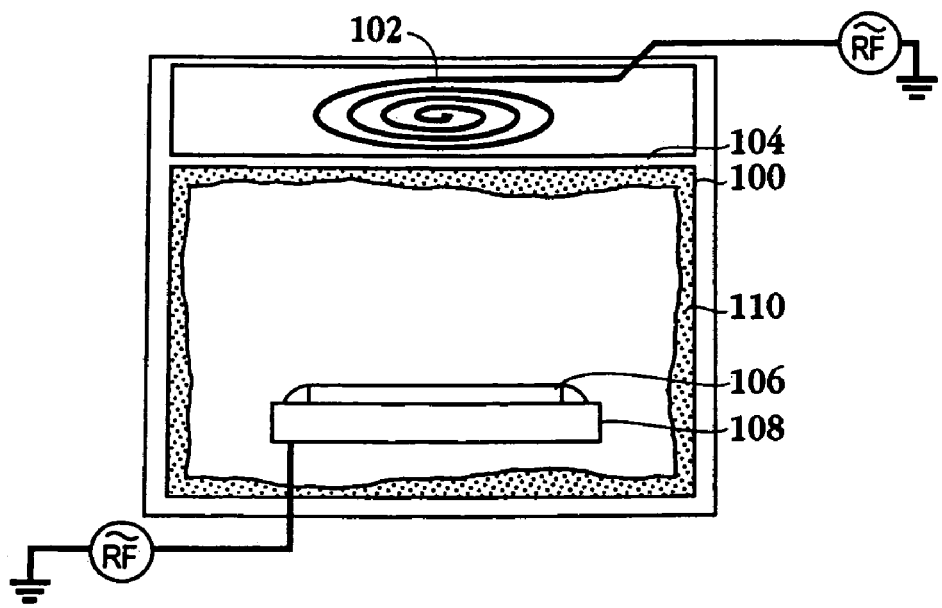
FIG. 1 is a simplified cross-sectional view of an etch chamber.
Figure 2:
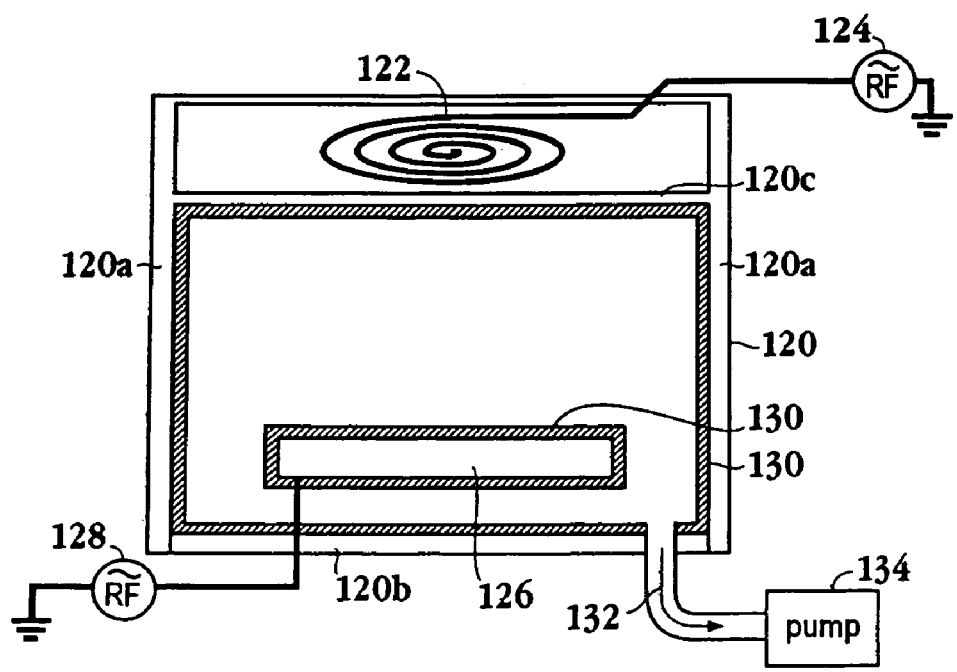
FIG. 2 is a cross-sectional schematic diagram of a semiconductor processing chamber having a polymer coating applied to the inner surfaces of the chamber in accordance with one embodiment of the invention.

FIG. 2 is a cross-sectional schematic diagram of a semiconductor processing chamber having a polymer coating applied to the inner surfaces of the chamber in accordance with one embodiment of the invention. Processing chamber 120 is defined by top 120c, base 120b, and side wall 120a extending between the top and the base. In one embodiment top 120c is a quartz or sapphire window. Electrode 122 is disposed above top 120c and provides the energy to create a plasma in processing chamber 120. Radio frequency (RF) supply 124 is in communication with electrode 122 and supplies the necessary power to the electrode for a processing operation in processing chamber 120. For example, processing chamber 120 can be used for etch or deposition processes commonly performed in semiconductor fabrication processes. Electrostatic chuck 126 is configured to support a wafer undergoing a processing operation. RF supply 128 supplies power to electrostatic chuck 126. Outlet 132 enables the evacuation of processing chamber 120 through pump 134.

Still referring to FIG. 2, polymer layer 130 is deposited on the inner surface of top 120c, base 120b, and sidewall 120a of processing chamber 120. Additionally, polymer layer 130 is deposited on the outer surface of electrostatic chuck 126. Thus, all the inner surfaces of processing chamber 120 are covered with polymer layer 130. Polymer layer 130 is a fluorine containing polymer. In one embodiment, polymer layer 130 is composed of a polymer having an average formula $CF_x$, where x is a real number between 1 and 4. That is, polymer layer 130 includes the elements of carbon and fluorine. As will be explained in more detail below, polymer layer 130 is deposited on the inner surfaces of processing chamber 120 through the creation of a perfluorocarbon feed gas plasma in the processing chamber.

Figure 3A:
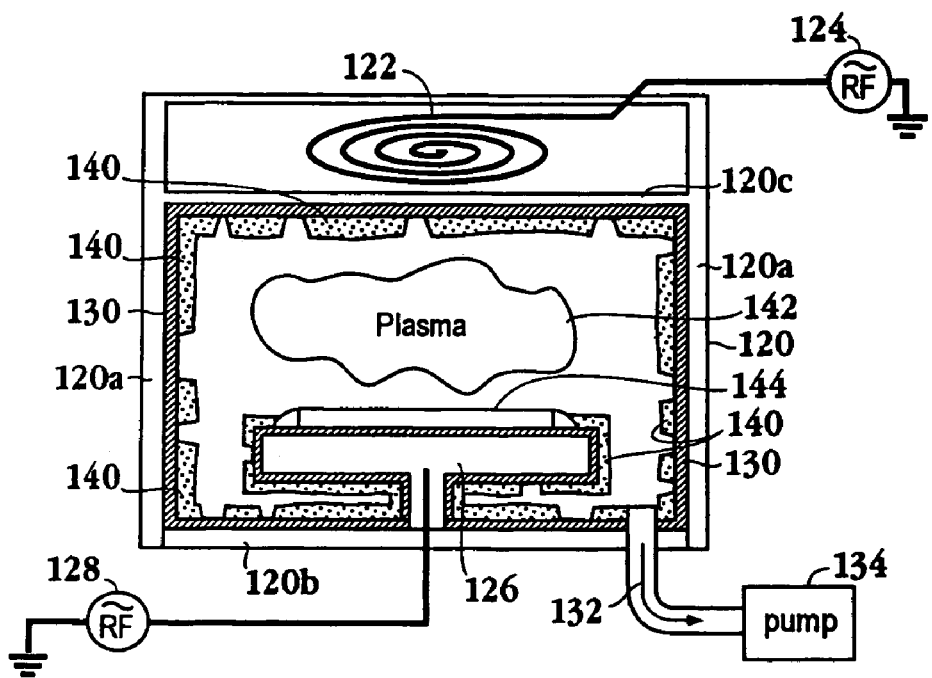
FIG. 3A is a cross-sectional schematic diagram of a semiconductor processing chamber having a residue deposited on the polymer coating applied to the inner surfaces of the chamber in accordance with one embodiment of the invention.

FIG. 3A is a cross-sectional schematic diagram of a semiconductor processing chamber having a residue deposited on the polymer coating applied to the inner surfaces of the chamber in accordance with one embodiment of the invention. Here, wafer 144 has undergone a processing operation, such as an etch or deposition operation. During the etch or deposition process plasma 142 is created inside process chamber 120. As a result of the processing operation, residue deposits 140 are formed over polymer coating layer 130. One skilled in the art will appreciate that where wafer 144 is silicon-based, silicon-based residues 144 are deposited on the inner surface of process chamber 120. Thus, the chamber walls of processing chamber 120 contain a mixture of silicon-based residues 144 on polymer coat layer 130. Processing chamber 120 can now be cleaned with an oxygen ($O_2$) plasma once the wafer has been removed as will be explained further with reference to FIG. 3B. It should be appreciated that other contaminants besides silicon can be deposited, such as tungsten, carbon, etc.

Figure 3B:
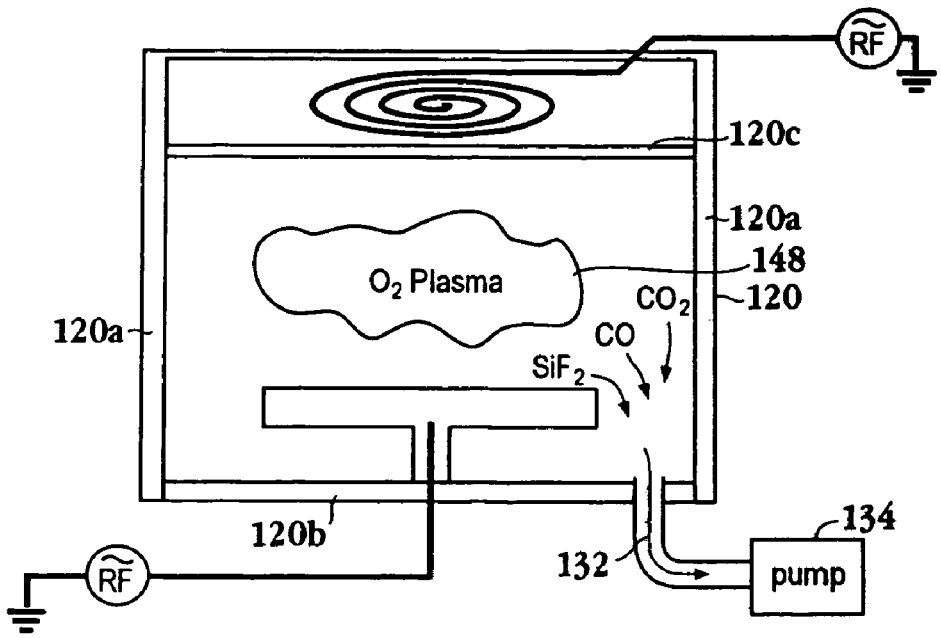
FIG. 3B is a cross-sectional schematic diagram of the semiconductor processing chamber of FIG. 3A after being subjected to an oxygen cleaning plasma in accordance with one embodiment of the invention.

FIG. 3B is a cross-sectional schematic diagram of the semiconductor processing chamber of FIG. 3A after being subjected to an oxygen cleaning plasma in accordance with one embodiment of the invention. Oxygen plasma 148 liberates the fluorine from the polymer coating of FIG. 3A by reacting with the carbon in the polymer coating to form carbon monoxide and carbon dioxide. The free fluorine released from the reaction between $O_2$ plasma 148 and the carbon removes silicon containing residue deposits, such as silicon oxy-halides and silicon oxide, by forming volatile $SiF_x$ and $Si_xF_y$ compounds, where x and y are integers. It should be appreciated that the volatile reaction species formed when removing residue deposits 140 and polymer coating layer 130 are pumped out of process chamber 120 by pump 134 through outlet 132. Additionally, one skilled in the art will appreciate that the embodiments of FIGS. 3A and 3B apply to inductively coupled, capacitively coupled process chambers, microwave discharges, electron cyclotron resonance (ECR), and helicon resonator discharges.

In one embodiment, the cycle defined by the deposition of the polymer coating prior to processing a wafer and the subsequent cleaning of the chamber after the processing, occurs for each wafer being processed. Thus, the chamber state is substantially the same for each wafer. In turn, drifts due to degradation and erosion of the chamber parts are substantially eliminated since each wafer sees the same chamber environment, i.e., the polymer coated walls. In addition, the attack of chamber parts by aggressive etch chemistries and the contamination of wafers from chamber materials are both minimized because of the polymer coating applied to the inner surfaces of the processing chamber. That is, the polymer coating not only provides a consistent chamber environment for each wafer, but also provides contamination protection for the wafers and protection for the chamber parts. Accordingly, the mean time between wet cleaning operations is extended, thereby allowing for continuous running of the equipment for longer periods in between wet cleaning operations.

Figure 4:
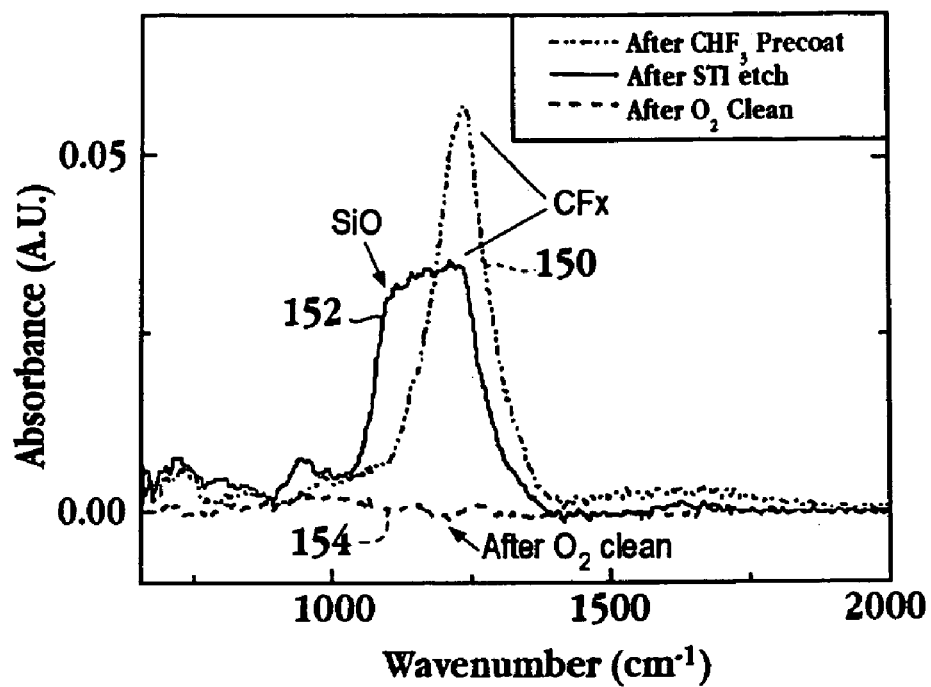
FIG. 4 is a graph comparing the absorbance of a polymer coating after deposition of the coating, after performing the processing operation and after a wafer-less cleaning operation in accordance with one embodiment of the invention.

FIG. 4 is a graph comparing the absorbance of a polymer coating after deposition of the coating, after performing the processing operation and after a wafer-less cleaning operation in accordance with one embodiment of the invention. The monitoring was performed by attenuated total internal reflection Fourier transform infrared (ATIR-FTIR) spectroscopy. As is known in the art, ATIR-FTIR is used to detect deposition on a ZnSe crystal located on a chamber wall. The deposition of the etch products appears in the ATIR-FTIR signal as absorbance of the infrared (IR) beam at silicon oxide stretches (1020–1270 $cm^{-1}$) and $CF_x$ absorbance (110–1400 $cm^{-1}$). Line 150 represents the absorbance due to the polymer coating ($CF_x$) deposited after exposing a clean chamber to $CHF_3$ plasma. Subsequent etching of a hard mask STI wafer in the process chamber with chlorine ($Cl_2$)/$O_2$ chemistry leads to deposition of silicon containing material on the chamber wall along with some removal the polymer coating.

Still referring to FIG. 4, line 152 represents the absorbance due to the deposition of the silicon containing material, i.e., silicon oxy-halides ($SiO_xF_yCl_zBr_n$) and silicon oxide ($SiO_2$), and the removal of some of the polymer coating after the etching operation. That is, a processing operation deposits SiO-containing residue and at the same time a portion of the polymer coating is removed. Upon completion of the STI process operation, a wafer-less auto clean is performed where an oxygen ($O_2$) plasma is created in the chamber. The oxygen plasma reacts with the carbon of the polymer coating and as a result, fluorine is released from the polymer coating. The released fluorine reacts with the silicon oxide containing deposit to form volatile compounds that are removed. Line 154 represents a baseline reading after the oxygen plasma cleaning. It should be appreciated that each wafer will see the same chamber environment when the above described process is performed and the polymer coating is re-applied. That is, the chamber environment is returned to a baseline level through the application of a polymer coating to the inner surfaces after each $O_2$ plasma cleaning operation.

Thus, both the carbon based deposits and the silicon based deposits are removed by the introduction of the $O_2$ plasma. The deposits are removed by the reactions described above where volatile compounds are formed and simultaneously pumped out of the chamber through an outlet in communication with a suitable pump. For example, silicon deposits forms silicon tetrafluoride ($SiF_4$), tungsten forms Tungsten hexafluoride ($WF_6$), carbon forms carbon tetrafluoride ($CF_4$) as well as carbon dioxide ($CO_2$), all of which are pumped out of the chamber. In one embodiment, the endpoint of the $O_2$ plasma clean operation can be determined by monitoring the 516.5 nanometer line, i.e., diatomic carbon ($C_2$) emission.

Figure 5:
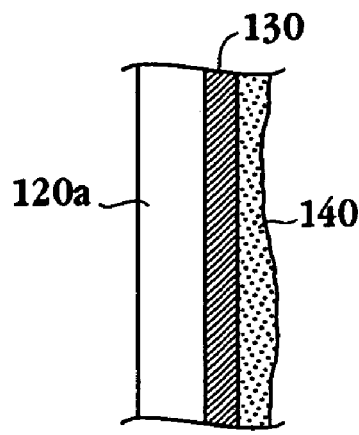
FIG. 5 is a partial, enlarged schematic diagram of the sidewall of the process chamber of FIG. 3A in accordance with one embodiment of the invention.

FIG. 5 is a partial, enlarged schematic diagram of the sidewall of the process chamber of FIG. 3A in accordance with one embodiment of the invention. Here, chamber sidewall 120a has polymer coating 130 disposed over the interior surface of the sidewall. After a processing operation, such as an etch or deposition operation, residue deposits 140 are disposed over the interior surface of polymer coating 130. It should be appreciated that residue deposits 140 are porous, and additionally not necessarily uniformly distributed or continuous. In one embodiment, a thickness of polymer coating 130 is less than 500 angstroms (Å). In another embodiment, the thickness of polymer coating 130 is less than 200 Å. In a preferred embodiment, the thickness of polymer coating 130 is between about 0 Å and about 50 Å. It should be appreciated that the top, base and sidewall of the process chamber can be constructed from any material suitable for the semiconductor process operations, such as aluminum, ceramic, aluminum coated with ceramic, and aluminum coated with silicon carbide.

Figure 6:
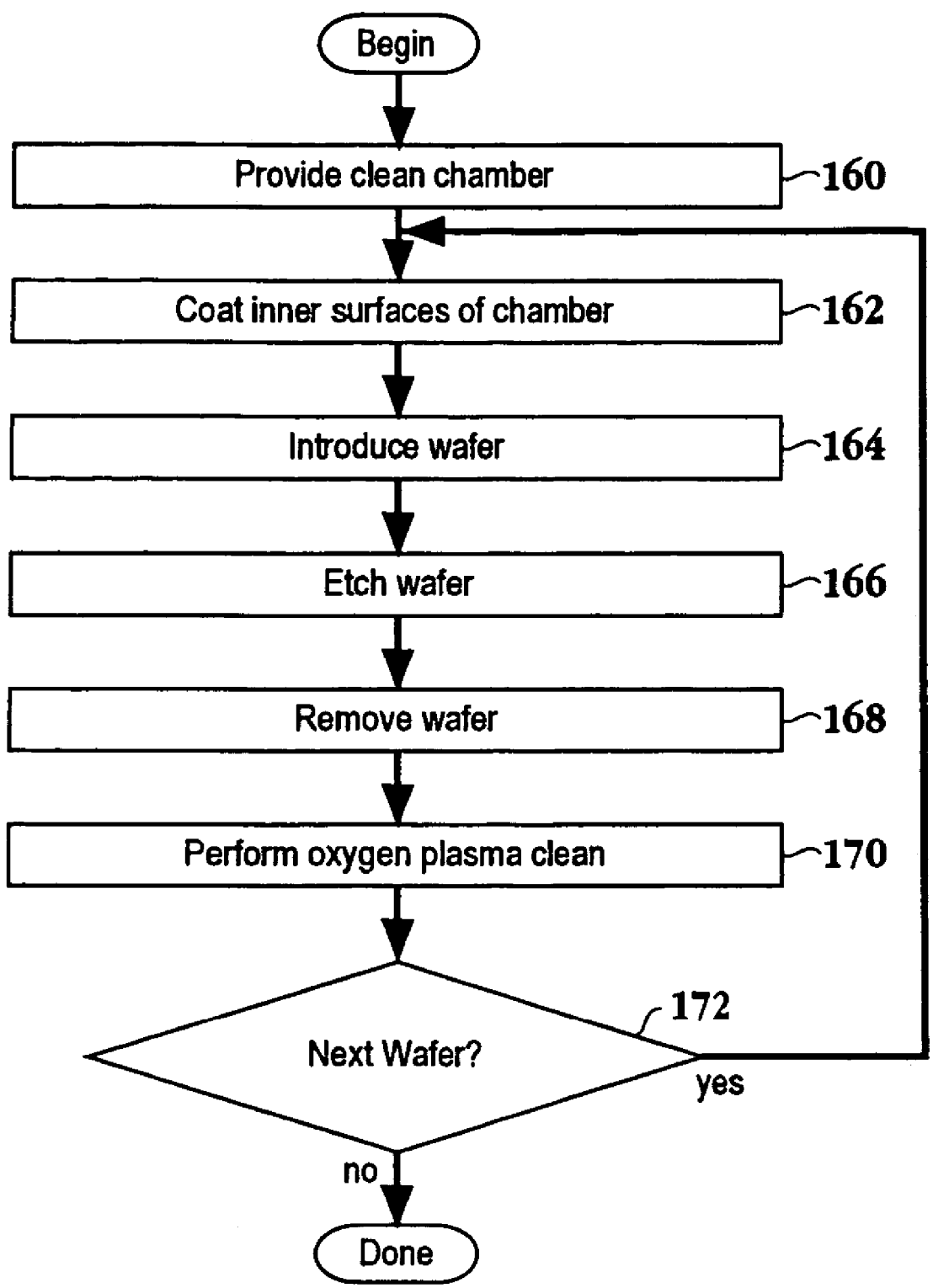
FIG. 6 is a flowchart diagram of the method operations for removing chamber deposits in between process operations in a semiconductor process chamber in accordance with one embodiment of the invention.

FIG. 6 is a flowchart diagram of the method operations for removing chamber deposits in between process operations in a semiconductor process chamber in accordance with one embodiment of the invention. The method initiates with operation 160 where a clean chamber is provided. Here the chamber is in a condition to begin a processing operation, such as a deposition or etch operation. The method then advances to operation 162 where the inner surfaces of the processing chamber are coated with a polymer coating. The polymer coating has a composition of carbon and fluorine. That is, in terms of a chemical formula, the polymer coating can be represented by $CF_x$. In one embodiment, a gas containing carbon and fluorine is introduced into the process chamber and a plasma is struck to deposit the $CF_x$ polymer coating. Table 1 illustrates approximate ranges for the process variables for coating the inner surfaces of the process chamber with the polymer coating when the gas containing carbon and fluorine is a mixture of $CH_2F_2$ and $CF_4$.

TABLE 1

| | Power (Watts) | | | Flow rate of | Pressure |
| --- | --- | --- | --- | --- | --- |
| | Top | Bottom | Temperature | Gases (sccm) | (milliTorr) |
| Approx.# | 800 W | 0 | 60° C. | $CH_2F_2$ - 100<br>$CF_4$ - 100 | 10 |
| Wide Range | 300–1500 W | 0 | 20° C.–100° C. | $CH_2F_2$ - 0–1000<br>$CF_4$ - 0–1000 | 1–200 |
| Middle Range | 300–1000 W | 0 | 40° C.–80° C. | $CH_2F_2$ - 0–200<br>$CF_4$ - 0–200 | 1–100 |

Table 1 illustrates the process ranges associated with $CH_2F_2$ and $CF_4$. However, it should be appreciated that any suitable gas or combination of gases can be used to deposit the fluorine containing polymer layer that acts as a solid source of fluorine for the oxygen cleaning plasma. Suitable gas combinations include the following combinations: $CHF_3/CF_4$, $CH_2F_2/CHF_3/CF_4$, $CH_2F_2/SF_6$, $CH_2F_2/CF_4/Ar/He$, $CH_2F_2/CF_4/He$, $CH_2F_2/CF_4/Ar$, $CHF_3/CF_4/Ar/He$. In addition, the gases containing carbon and fluorine can be used individually in another embodiment, such as $C_2F_6$, $CH_2F_2$, $C_3F_8$, $C_4F_8$, $CH_3F$ and $CHF_3$. The process variables include power supplied to a top electrode and a bottom electrode, temperature inside the chamber, flow rate of gases into the chamber an pressure in the chamber.

Returning to FIG. 6, the method then proceeds to operation 164 where a wafer to be processed is introduced into the pre-coated chamber. The method then moves to operation 166 where the wafer is etched. Of course, the process operation is not limited to an etching operation. For example the operation could be a deposition operation or photoresist stripping operation. The method then advances to operation 168 where the wafer is removed from the processing chamber upon the completion of the process operation. It should be appreciated that during the processing of the wafer, chamber deposits are left on the polymer coating of the inner surfaces of the processing chamber. The method then proceeds to operation 170 where an oxygen plasma cleaning is performed. Table 2 illustrates approximate ranges for the process variables for the oxygen plasma cleaning process.

TABLE 2

| | Top Power (Watts) | Bottom Power (Watts) | Temperature ° C. | Flow Rate (sccm) | Pressure (milliTorr) |
| --- | --- | --- | --- | --- | --- |
| Approx. | 800 | 0 | 60 | 200 | 15 |
| Wide range | 300–1500 W | 0 | 20–100 | 50–1000 | 1–200 |
| Middle Range | 300–1000 W | 0 | 40–80 | 50–500 | 1–50 |

Table 2 illustrates the process variables when oxygen is the gas being introduced into the processing chamber. Similar to table 1, the process variables include the top power supplied to a top electrode of the chamber, the bottom power, temperature of the chamber, flow rate of oxygen into the chamber and the pressure of the chamber. It should be appreciated that oxygen can be mixed with an inert gas such as argon and/or helium. In one embodiment, the oxygen is mixed with argon, which in turn makes the plasma more intense. Thus, the removal rate of the chamber deposits and the polymer coating can be increased. When oxygen is mixed with an inert gas, the process variables of Table 2 would be the same, while the flow rate of the inert gas is between 0 and a flow equal to the flow rate of the oxygen. It should be appreciated that the process variables of Tables 1 and 2 may vary slightly for different types of process tools as well as different geometries of the same process tools. Thus, the process ranges are exemplary and not meant to be limiting. In one embodiment the process variables are applied to TCP9400 series tools. In another embodiment the process variables are applied to 2300 series tools.

Returning to FIG. 6, the method advances to decision operation 172 where it is determined if another wafer is to be processed. If there is another wafer, then the method returns to operation 162 where the inner surfaces of the chamber are coated with the polymer coating and the above described processes are repeated. It should be appreciated that the chamber environment experienced by each wafer is substantially the same because of the polymer coating applied to the inner surfaces of the processing chamber after the oxygen plasma wafer-less auto clean. If it is determined that there is not another wafer in decision operation 172, then the method terminates.

Figure 7:
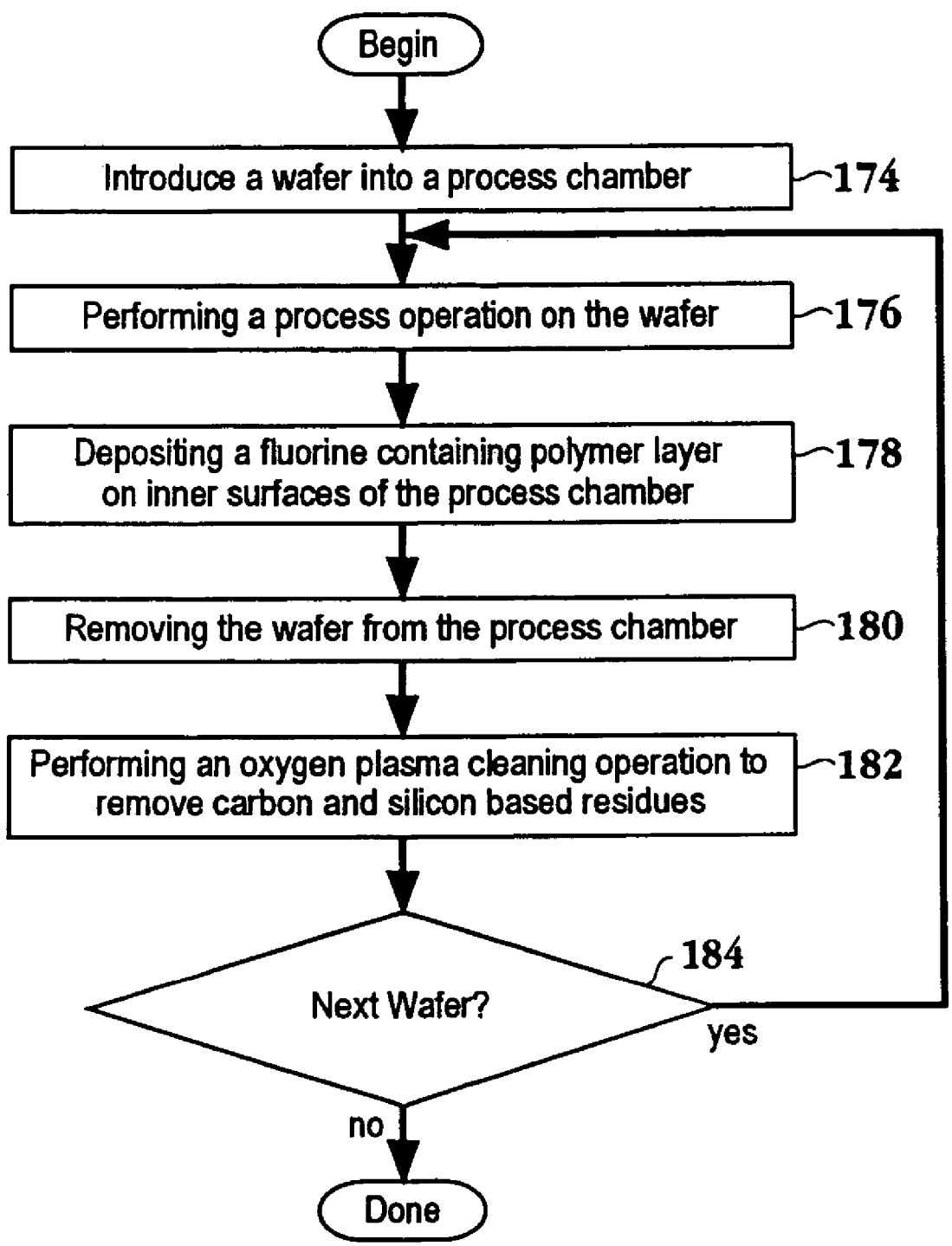
FIG. 7 is a flowchart diagram of the method operations for cleaning a process chamber to provide substantially similar starting conditions for each process operation in accordance with one embodiment of the invention.

FIG. 7 is a flowchart diagram of the method operations for cleaning a process chamber to provide substantially similar starting conditions for each process operation in accordance with one embodiment of the invention. The method initiates with operation 174 where a wafer is introduced into a processing chamber. Here, the chamber is in a condition to begin a processing operation, such as a deposition or etch operation and is in a clean state. The method then moves to operation 176 where the process operation is performed, i.e., the etch or deposition operation is performed. The method then advances to operation 178 where a fluorine containing polymer layer is deposited on the inner surfaces of the process chamber. It should be appreciated that during the processing of the wafer, the fluorine containing polymer layer is deposited on the inner surfaces of the process chamber in this embodiment. The processing operation depositing a fluorine containing polymer layer during the processing operation include operations, such as nitride mask open, oxide mask open, and bottom anti-reflective coating (BARC) etch processes using $CH_2F_2$ as a process gas and any other etch process for a stack that uses one of the gases or gas combinations described with reference to TABLE 1.

The method of FIG. 7 then advances to operation 180 where the wafer is removed from the processing chamber upon the completion of the process operation. It should be appreciated that during the processing of the wafer, chamber deposits are left on the polymer coating of the inner surfaces of the processing chamber. One skilled in the art will appreciate that the inner surfaces of the processing chamber are coated in concert with the initiation of the above mentioned processes with reference to method operation 178. The method then proceeds to operation 182 where an oxygen plasma cleaning is performed. In one embodiment, the process variables described with reference to TABLE 2 are used for performing the oxygen plasma cleaning. The method then advances to decision operation 184 where it is determined if another wafer is to be processed. If there is another wafer to be processed, then the method returns to operation 176 where the process operation is performed on the next wafer and the inner surfaces of the chamber are simultaneously coated with the polymer coating upon the initiation of process operation as described above. It should be appreciated that the chamber environment experienced by each wafer is substantially the same because of the polymer coating being applied to the inner surfaces of the processing chamber upon the initiation of the process operation. If it is determined that there is not another wafer in decision operation 184, then the method terminates.

Figure 8:
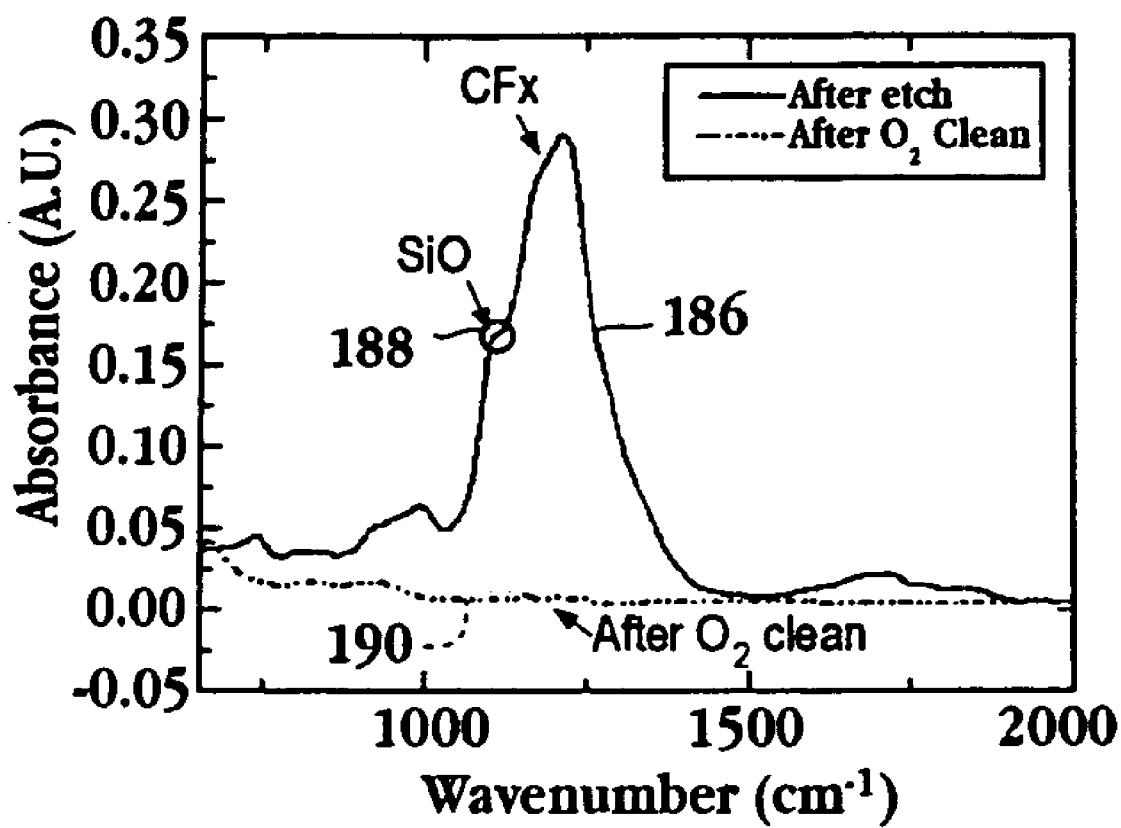
FIG. 8 is a graph of the absorbance of a polymer coating after deposition of the coating simultaneous with an in-situ shallow trench isolation (STI) process as compared with the absorbance measured after a wafer-less oxygen plasma cleaning operation in accordance with one embodiment of the invention.

FIG. 8 is a graph of the absorbance of a polymer coating after deposition of the coating simultaneous with an in-situ shallow trench isolation (STI) process as compared with the absorbance measured after a wafer-less oxygen plasma cleaning operation in accordance with one embodiment of the invention. Similar to FIG. 4, the monitoring for FIG. 8 was performed by attenuated total internal reflection Fourier transform infrared (ATIR-FIIR) spectroscopy. Here, a polymer coating is deposited on the inner surfaces of a chamber due to an in-situ STI process. More particularly, a nitride layer etch using $CH_2F_2$ and $CF_4$ was performed here to deposit the $CF_x$ polymer coating on the inner surfaces of the processing chamber during the processing step. Line 186 represents the absorbance after the processing operation. Region 188 of line 186 is a shoulder representing silicon oxide deposits on the inner surfaces of the processing chamber.

Line 190 of FIG. 8 represents a baseline reading after the oxygen plasma cleaning. It should be appreciated that each wafer will see the same chamber environment when the solid source of fluorine is deposited on the chamber interior surfaces at the initiation of the processing operation. An oxygen plasma cleaning operation is then performed to remove the $CF_x$ layer and the residue deposits from the processing operation, such as silicon based and carbon based deposits. That is, a substantially similar absorbance reading is obtained after each oxygen plasma cleaning when the polymer coating is deposited on the inner surfaces of the chamber upon the initiation of the processing operation. Thus, both the carbon based deposits and the silicon based deposits are removed by the introduction of the $O_2$ plasma. The deposits are removed by the reactions described above where volatile compounds are formed and simultaneously pumped out of the chamber through an outlet in communication with a suitable pump.

In summary, a method for coating the inner surfaces of a processing chamber with a polymer coating to provide a substantially constant chamber environment for each processing wafer is provided. The polymer coating can be applied prior to a processing operation or as part of the processing operation. The polymer coating allows each wafer to see substantially constant repeatable chamber conditions by depositing a sacrificial $CF_x$ polymer prior to or concurrent with the processing operation. An oxygen plasma cleaning step is then sufficient to remove the polymer coating and any residue deposits from the processing operation. Accordingly, drifts due to chamber material aging can be substantially eliminated due to the protection provided from the aggressive process chemistries offered by the polymer coating. Furthermore, contamination from chamber parts, e.g., metal contamination, can be substantially eliminated by the polymer coating. In one embodiment, the polymer coating is re-applied after each wafer is processed. In another embodiment, the polymer coating is applied between about once every wafer to about once every 25 wafers.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor plasma processing chamber, comprising:
   RF top electrode in communication with a power supply; and
   a processing chamber defined within a base, a sidewall extending from the base, and a continuous top disposed on the sidewall, the processing chamber having an outlet enabling removal of fluids within the processing chamber, the processing chamber including,
      a substrate support;

an inner surface of the processing chamber defined by the base, the sidewall and the top, the inner surface is coated with a fluorine containing polymer coating, and an outer surface of the substrate support coated with the fluorine containing polymer coating, wherein the fluorine containing polymer coating is formed prior to semiconductor processing to accept residue deposits during processing operations performed within the processing chamber wherein the top electrode is disposed over the top of the processing chamber, wherein the top of the processing chamber is a window allowing energy from the top electrode to pass therethrough, and wherein the window is composed of a material different from the base and the sidewall.

2. The semiconductor processing chamber of claim 1, wherein the fluorine containing polymer coating includes a carbon component and a fluorine component.

3. The semiconductor processing chamber of claim 1, wherein the substrate support is an electrostatic chuck.

4. The semiconductor processing chamber of claim 1, wherein the fluorine containing polymer coating has a thickness of less than 500 angstroms (Å).

5. The semiconductor processing chamber of claim 1, wherein the fluorine containing polymer coating has a thickness of less than 50 angstroms (Å).

6. The semiconductor processing chamber of claim 1, wherein the base and the sidewall are formed from the group consisting of aluminum, ceramic, aluminum coated with ceramic, and aluminum coated with silicon carbide.

7. The semiconductor processing chamber of claim 1, wherein the top electrode is isolated from the processing chamber.

8. The semiconductor processing chamber of claim 1, wherein the window is composed of one of sapphire or quartz.

9. The semiconductor processing chamber of claim 1, wherein the substrate support is in communication with a substrate support power supply.

* * * * *